(12) United States Patent
Nishimae et al.

(10) Patent No.: US 10,714,902 B2
(45) Date of Patent: Jul. 14, 2020

(54) LASER OSCILLATOR

(71) Applicant: Mitsubishi Electric Corporation, Tokyo (JP)

(72) Inventors: Junichi Nishimae, Tokyo (JP); Tomotaka Katsura, Tokyo (JP); Daiji Morita, Tokyo (JP); Hiroaki Kurokawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/338,694

(22) PCT Filed: Mar. 1, 2017

(86) PCT No.: PCT/JP2017/008175
§ 371 (c)(1),
(2) Date: Apr. 2, 2019

(87) PCT Pub. No.: WO2018/158892
PCT Pub. Date: Sep. 7, 2018

(65) Prior Publication Data
US 2019/0363517 A1 Nov. 28, 2019

(51) Int. Cl.
*H01S 5/40* (2006.01)
*G02B 27/10* (2006.01)
*H01S 5/10* (2006.01)

(52) U.S. Cl.
CPC ........ *H01S 5/4012* (2013.01); *G02B 27/1006* (2013.01); *H01S 5/1096* (2013.01); *H01S 5/4087* (2013.01)

(58) Field of Classification Search
CPC .... H01S 5/4012; H01S 5/4087; H01S 5/1096; H01S 5/14; G02B 27/1006
See application file for complete search history.

(56) References Cited

U.S. PATENT DOCUMENTS 4,250,465 A 2/1981 Leib
7,199,924 B1 * 4/2007 Brown ............... G02B 27/1006
359/556

(Continued)

FOREIGN PATENT DOCUMENTS

JP  2013-521666 A  6/2013
JP  6223650 B1  11/2017

(Continued)

OTHER PUBLICATIONS

International Search Report dated May 16, 2017 PCT/JP2017/008175, filed Mar. 1, 2017, 6 pages including English translation.

(Continued)

*Primary Examiner* — Xinning(Tom) Niu
(74) *Attorney, Agent, or Firm* — Xsensus LLP

(57) ABSTRACT

A laser oscillator includes: a plurality of laser media to emit laser beams having different wavelengths; a diffraction grating to emit, in a superimposed state, the laser beams incident from the laser media; a partially reflective element to reflect part of the laser beams emitted from the diffraction grating and return the part of the laser beams to the diffraction grating, and to transmit a remainder; and a plurality of lenses each disposed between a corresponding one of the laser media and the diffraction grating. The lenses are each disposed in an optical path formed between a corresponding one of the laser media and the diffraction grating, and the lenses superimpose the laser beams from the laser media on an incident surface of the diffraction grating such that the laser beams have an equal outer diameter.

12 Claims, 4 Drawing Sheets

(56) References Cited

U.S. PATENT DOCUMENTS

| | | |
|---|---|---|
| 2007/0297477 A1 | 12/2007 | Hersman |
| 2011/0216792 A1* | 9/2011 | Chann ................ G02B 27/0905 372/31 |
| 2014/0044436 A1* | 2/2014 | Lee ........................ H04B 10/40 398/135 |
| 2014/0064305 A1 | 3/2014 | Sipes, Jr. et al. |
| 2015/0331245 A1 | 11/2015 | Tayebati et al. |
| 2016/0161752 A1 | 6/2016 | Negoita et al. |
| 2016/0344162 A1 | 11/2016 | Konno et al. |
| 2018/0026425 A1 | 1/2018 | Usuda |

FOREIGN PATENT DOCUMENTS

| | | |
|---|---|---|
| WO | 2011/109760 A2 | 9/2011 |
| WO | 2015/115301 A1 | 8/2015 |
| WO | 2016/152404 A1 | 9/2016 |

OTHER PUBLICATIONS

Decision to Grant for Japanese Patent Application No. 2017-539693, dated Sep. 12, 2017, 6 pages including English translation.
German Office Action dated Feb. 26, 2020 from the German patent office in application No. 112017005700.0.
Chinese Office Action dated Mar. 5, 2020, issued in corresponding Chinese Patent Application No. 201780074812.2, 20 pages with a machine generated English Translation.

* cited by examiner

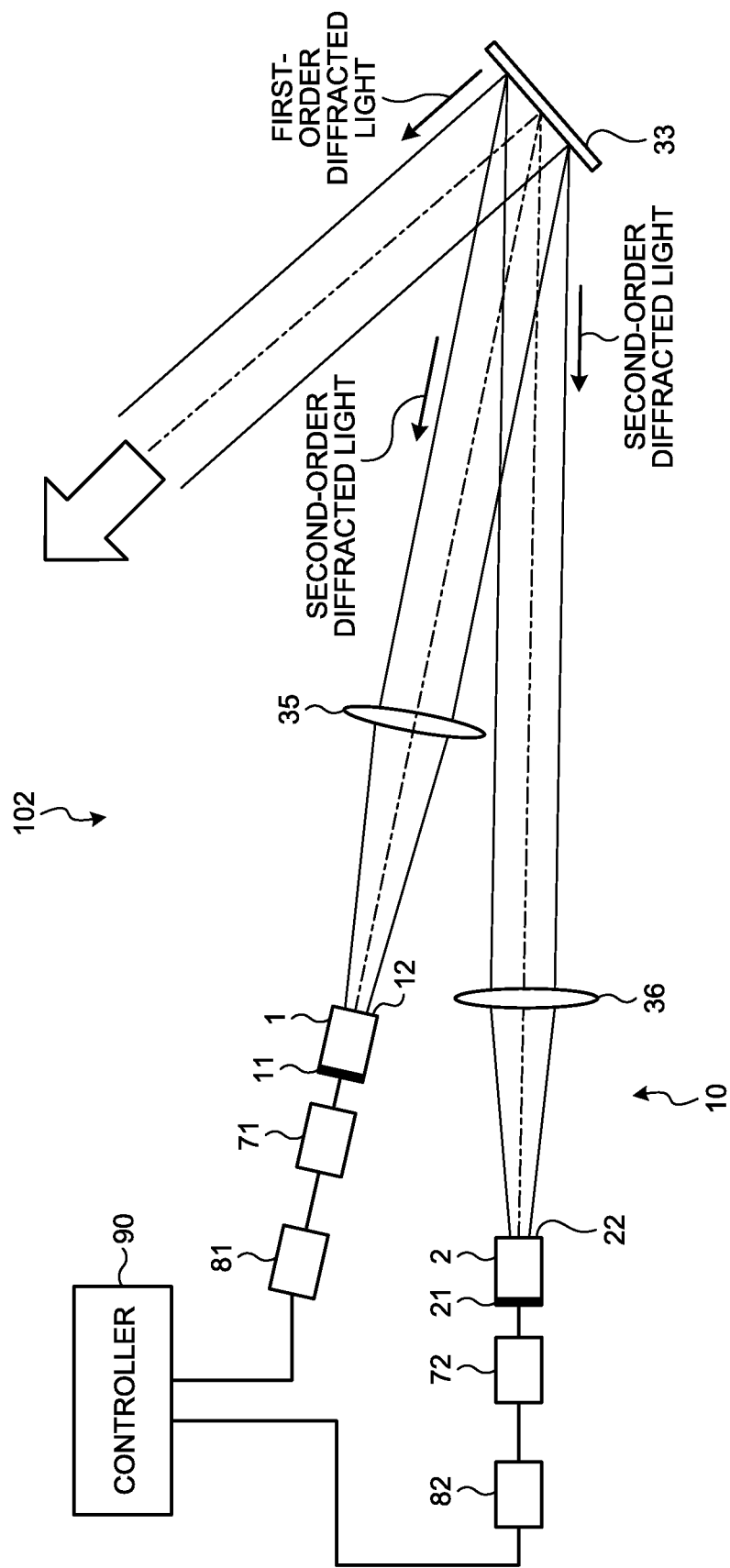

LASER OSCILLATOR

CROSS-REFERENCE TO RELATED APPLICATIONS

The present application is based on PCT filing PCT/JP2017/008175, filed Mar. 01, 2017, which is incorporated herein by reference.

FIELD

The present invention relates to a laser oscillator that obtains a high-output laser beam by coupling a plurality of laser beams having different wavelengths.

BACKGROUND

To increase the intensity of laser beams, there have been attempts made to perform, by using wavelength dispersive elements, wavelength coupling on a plurality of laser beams having different wavelengths emitted from a plurality of laser media. Performing "wavelength coupling" in this specification means causing a plurality of laser beams having different wavelengths to exit at the same exit angle, i.e., a plurality of laser beams having different wavelengths are superimposed on each other to form one laser beam.

Patent literature 1 discloses a technology in which an external resonator that includes a plurality of laser media and a wavelength dispersive element sets the wavelengths of the laser beams emitted from the laser media to a unique value and another wavelength dispersive element installed outside the external resonator couples the laser beams emitted from the laser media.

CITATION LIST

Patent Literature

Patent Literature 1: Japanese translation of PCT international application No. 2013-521666

SUMMARY

Technical Problem

In the invention disclosed in Patent literature 1 described above, however, a plurality of laser beams having the same wavelength and the same optical characteristics are incident on the wavelength dispersive element; therefore, the laser beams cannot be superimposed with the same beam diameter on the wavelength dispersive element, i.e., the laser beams are displaced from each other on the wavelength dispersive element. Consequently, a plurality of laser beams having different beam diameters are resonated by the external resonator; therefore, there is a problem in that the light-harvesting of the laser beams output from the external resonator degrades and the output power of the external resonator is reduced.

The present invention has been achieved in view of the above and an object of the present invention is to provide a laser oscillator that has improved light-harvesting of the laser beams output from an external resonator.

Solution to Problem

In order to solve the above problems and achieve the object, an aspect of the present invention is a laser oscillator including: a plurality of laser media to emit laser beams having different wavelengths; a wavelength dispersive element to emit, in a superimposed state, the laser beams incident from the laser media; a partially reflective element to reflect part of the laser beams emitted from the wavelength dispersive element and return the part of the laser beams to the wavelength dispersive element, and to transmit a remainder; and a plurality of lenses each disposed between a corresponding one of the laser media and the wavelength dispersive element. The lenses are each disposed in an optical path formed between a corresponding one of the laser media and the wavelength dispersive element, and the lenses superimpose the laser beams from the laser media on an incident surface of the wavelength dispersive element such that the laser beams have an equal outer diameter.

Advantageous Effects of Invention

The laser oscillator according to the present invention has an effect in which light-harvesting of the laser beams output from an external resonator can be improved.

BRIEF DESCRIPTION OF DRAWINGS

FIG. 4 is a diagram illustrating the configuration of a laser oscillator according to a third embodiment of the present invention.

DESCRIPTION OF EMBODIMENTS

A laser oscillator according to embodiments of the present invention will be described below in detail with reference to the drawings. This invention is not limited to the embodiments.

First Embodiment

Figure 1:
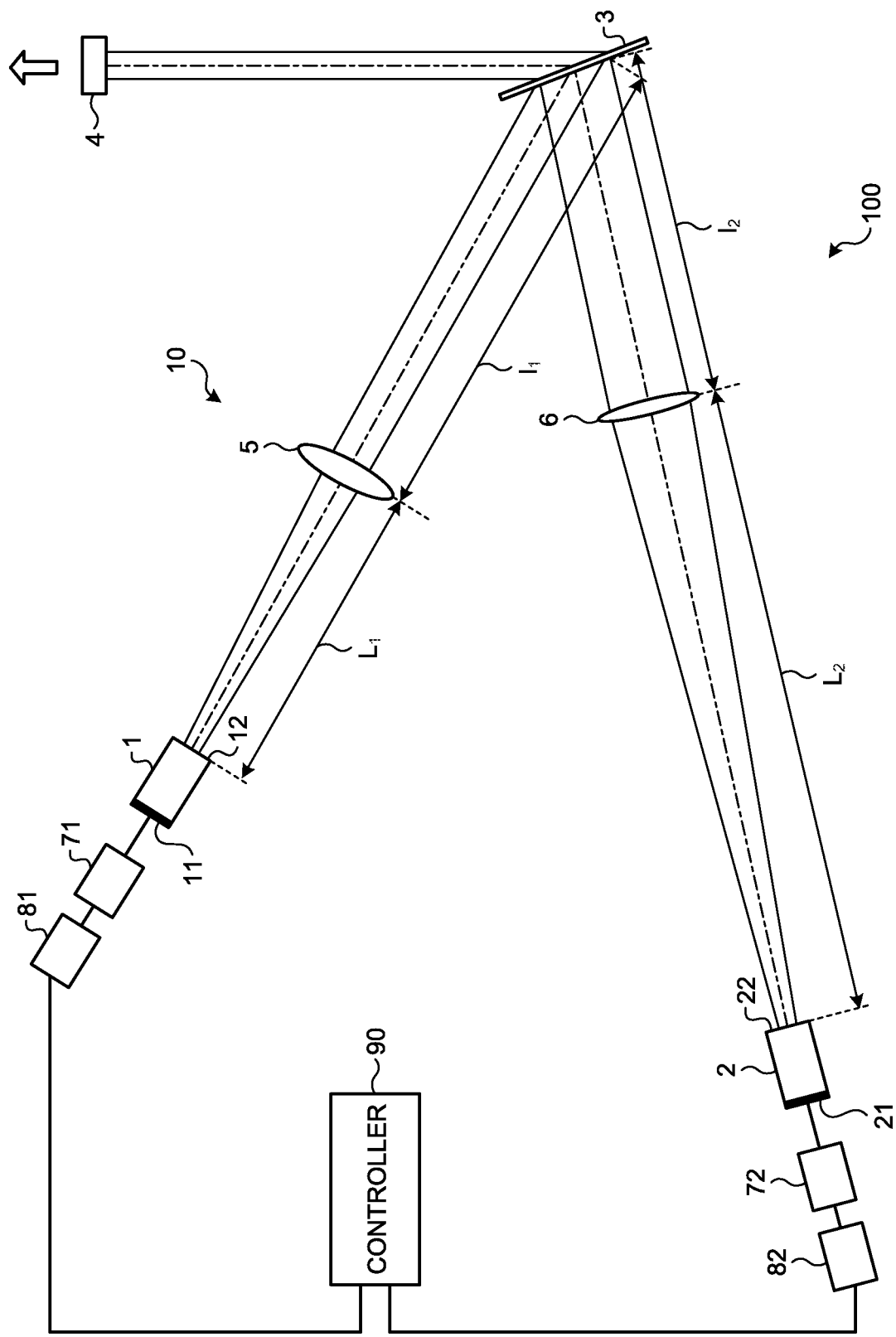
FIG. 1 is a diagram illustrating the configuration of a laser oscillator according to a first embodiment of the present invention.

FIG. 1 is a diagram illustrating the configuration of a laser oscillator according to a first embodiment of the present invention. A laser oscillator 100 according to the first embodiment includes a controller 90, drive circuits 71 and 72, drive power sources 81 and 82, and an external resonator 10. The external resonator 10 includes laser media 1 and 2, which emit laser beams having different wavelengths, and a partially reflective mirror 4, which is a partially reflective element that reflects part of the incident light and transmits the remainder. A diffraction grating 3 and lenses 5 and 6 are placed in the external resonator 10. The diffraction grating 3 is a wavelength dispersive element that emits, in a superimposed state, laser beams having different wavelengths incident from the laser media 1 and 2. The lenses 5 and 6 are placed between the laser media 1 and 2 and the diffraction grating 3, and they have different focal lengths. The lens 5 is placed in the optical path formed between the laser medium 1 and the diffraction grating 3, and the lens 6 is placed in the optical path formed between the laser medium 2 and the diffraction grating 3. The lenses 5 and 6 cause the laser beams incident from the laser media 1 and 2 to superimpose on the incident surface of the diffraction grating 3 such that the laser beams have the same outer diameter. The laser beam that is not perpendicularly incident on the incident surface of the diffraction grating 3 has an elliptical shape on the incident surface of the diffraction grating 3. In this specification, superimposing laser beams that are not perpendicularly incident on the diffraction grating 3 such that they have the same outer diameter means matching the lengths of the major axes of the ellipses with each other in order to superimpose the laser beams. The drive circuits 71 and 72 control turning on and off of the laser media 1 and 2 and have a protection function of interrupting the power supply to the laser media 1 and 2 when a short-circuit occurs. The drive power sources 81 and 82 are power sources that supply power to the drive circuits 71 and 72. The controller 90 controls the drive circuits 71 and 72 in accordance with the commands input from a numerical control device.

The laser media 1 and 2 are excited by light or electricity to generate laser light. Examples of the laser media 1 and 2 include an active layer of a semiconductor laser and a core of a fiber laser; however, the laser media 1 and 2 are not limited thereto. Reflective coatings 11 and 12, which are highly reflective and provided on the rear facets of the laser media 1 and 2, reflect majority of the light. Thus, the light generated by the laser media 1 and 2 is emitted forward from front facets 12 and 22.

The divergence angles of the laser beams emitted from the laser media 1 and 2 are adjusted by the lenses 5 and 6, respectively. The lenses 5 and 6 have different focal distances. The lenses 5 and 6 are placed at positions adjusted for the laser media 1 and 2, respectively. In FIG. 1, the distance between the laser medium 1 and the lens 5 is $L_1$ on the optical axis of the laser beam, and the distance between the laser medium 2 and the lens 6 is $L_2$ on the optical axis of the laser beam. The laser beams that have passed through the lenses 5 and 6 are incident on the diffraction grating 3 that is placed at a position adjusted for each of the laser media 1 and 2. In FIG. 1, the distance between the center of the lens 5 and the diffraction grating 3 is $l_1$ on the optical axis of the laser beam, and the distance between the center of the lens 6 and the diffraction grating 3 is $l_2$ on the optical axis of the laser beam.

The lenses 5 and 6 may be axisymmetric lenses, for example, spherical lenses. More preferably, the lenses 5 and 6 are cylindrical lenses that have power only in the beam coupling dimension, which is a plane parallel to the surface of FIG. 1. This is because, as will be described below, the lenses 5 and 6 corrects a beam diameter conversion effect in the beam coupling dimension and it is desirable that the correction does not affect a non-beam-coupling dimension, which is a plane perpendicular to the surface of FIG. 1. If the lenses 5 and 6 are concave lenses, the distances $L_1$ and $L_2$ between the laser media 1 and 2 and the centers of the lenses 5 and 6, respectively, and the distances $l_1$ and $l_2$ between the centers of the lenses 5 and 6 and the diffraction grating 3, respectively, are shorter than those in the case where the lenses 5 and 6 are convex lenses. Thus, using concave lenses for the lenses 5 and 6 can reduce the size of the external resonator 10.

The laser beams generated by the laser media 1 and 2 reach the diffraction grating 3 via the lenses 5 and 6. The relation between an incident angle $\alpha$ on the diffraction grating 3 and a diffraction angle $\beta$, which is the exit angle from the diffraction grating 3, is represented by the following equation (1):

$$d(\sin \alpha + \sin \beta) = m\lambda \quad (1)$$

where d is the interval between the grooves in the diffraction grating 3, $\lambda$ is the wavelength, and m is a natural number referred to as the order of diffraction.

As illustrated in FIG. 1, the laser beam from the laser medium 1 and the laser beam from the laser medium 2 are incident on the diffraction grating 3 at different incident angles and exit the diffraction grating 3 at the same diffraction angle. This means that the laser beam emitted from the laser medium 1 and the laser beam emitted from the laser medium 2 are superimposed to form one laser beam at the diffraction grating 3, and this one laser beam is emitted toward the partially reflective mirror 4. The partially reflective mirror 4 reflects part of the laser beam diffracted by the diffraction grating 3, and it transmits the remainder to be output from the external resonator 10. The laser beam output from the external resonator 10 is used for various applications, for example, laser machining.

The laser beam reflected by the partially reflective mirror 4 retraces the optical path described above and returns to the laser media 1 and 2 via the diffraction grating 3 and the lenses 5 and 6. The laser beams that have returned to the laser media 1 and 2 are amplified in the laser media 1 and 2; are reflected by the reflective coatings 11 and 21 on the rear side of the laser media 1 and 2; and are then reemitted from the laser media 1 and 2.

In the case where the external resonator 10 is functioning, the optical path is determined for each of the laser media 1 and 2 by the positional relation between the partially reflective mirror 4, the diffraction grating 3, the lenses 5 and 6, and the laser media 1 and 2. By determining the optical paths, the unique wavelength satisfying equation (1) described above can also be determined. The laser oscillator 100 according to the first embodiment superimposes the laser beams from the laser media 1 and 2, which have different wavelengths, on the incident surface of the diffraction grating 3 such that they have the same outer diameter, and it then emits one laser beam obtained by the superimposing from the diffraction grating 3 toward the partially reflective mirror 4. Therefore, the laser oscillator 100 according to the first embodiment can increase the intensity of the laser beam.

Figure 2:
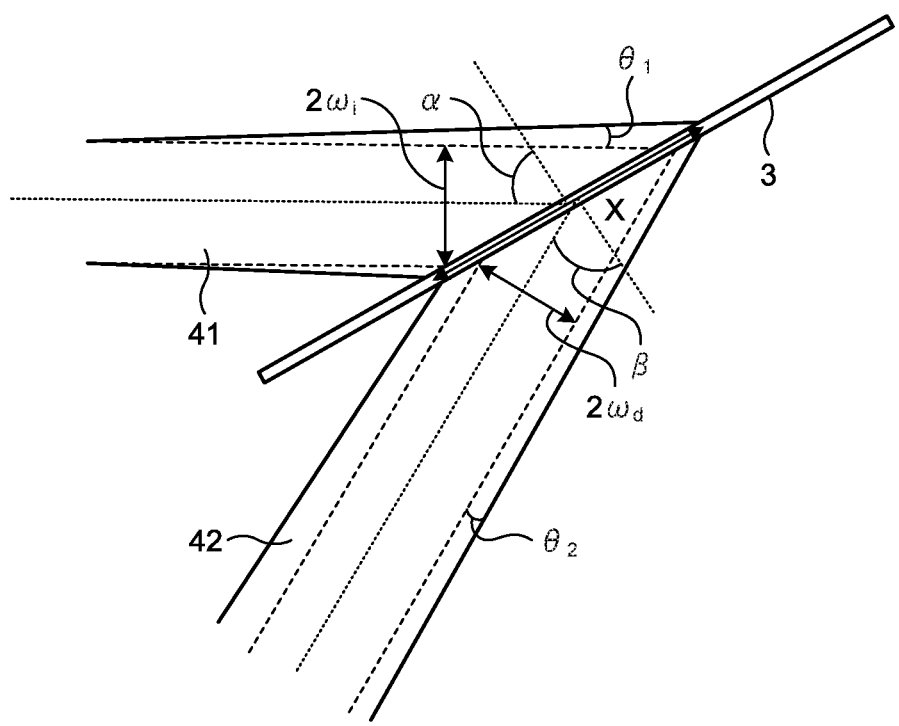
FIG. 2 is a diagram describing a beam diameter conversion effect in a diffraction grating in the laser oscillator according to the first embodiment.

If the incident angle $\alpha$ and the diffraction angle $\beta$ are different from each other, the diffraction grating 3 has a beam diameter conversion effect. FIG. 2 is a diagram describing the beam diameter conversion effect in the diffraction grating in the laser oscillator according to the first embodiment. In FIG. 2, the beam width x on the diffraction grating 3 is represented by $x = 2\omega_i/\cos \alpha = 2\omega_d/\cos \beta$, where $2\omega_i$ is the beam diameter of an incident beam 41 and $2\omega_d$ is the beam diameter of a diffraction beam 42. Thus, the following equation (2) holds between the beam diameter $2\omega_i$ of the incident beam 41 and the beam diameter $2\omega_d$ of the diffraction beam 42:

$$\omega_d = (\cos \beta / \cos \alpha) \omega_i \quad (2)$$

This means that the beam diameter of the laser beam that has passed through the diffraction grating 3 is $(\cos \beta / \cos \alpha)$ times larger than it was before passing through the diffraction grating 3. To put it differently, if the incident angle $\alpha$ or the diffraction angle $\beta$ is different, the beam diameter of the laser beam that has passed through the diffraction grating 3 changes. The relation between the laser beams before and after passing through the diffraction grating 3 is that the product of the beam diameter and the divergence angle is the same. Thus, the following equation (3) is satisfied:

$$2\omega_i \times \theta_1 = 2\omega_d \times \theta_2 \quad (3)$$

where $\theta_1$ is the divergence angle of the incident beam 41 and $\theta_2$ is the divergence angle of the diffraction beam 42.

Equation (3) is modified using equation (2) to obtain the following equation (4):

$$\theta_2 = (\cos\alpha/\cos\beta)\theta_1 \quad (4)$$

This means that the divergence angle $\theta_2$ of the diffraction beam 42 is $(\cos\alpha/\cos\beta)$ times the divergence angle $\theta_1$ of the incident beam 41. Thus, a ray matrix A of the diffraction grating 3 is represented by the following equation (5):

[Mathematical Formula 1]

$$A = \begin{pmatrix} \dfrac{\cos\beta}{\cos\alpha} & 0 \\ 0 & \dfrac{\cos\alpha}{\cos\beta} \end{pmatrix} \quad (5)$$

Equation (5) indicates that if laser beams having different wavelengths but having the same beam diameter and divergence angle are incident on the diffraction grating 3 at different incident angles $\alpha$, then the laser beams are diffracted into different diameters and at different divergence angles.

If the external resonator 10 resonates laser beams having different beam characteristics, the efficiency of the output laser beams is reduced and the light-harvesting degrades.

In the first embodiment, the distances $L_1$, $l_1$, $L_2$, and $l_2$ and the focal distances of the lenses 5 and 6 are adjusted such that the laser beams from the laser media 1 and 2 are emitted from the diffraction grating 3 with the same beam outer diameter. Using the ray matrix of the diffraction grating 3 represented by equation (5), the ray matrix of free propagation for the distances $L_1$, $L_2$, $l_1$, and $l_2$, and the ray matrix of the lenses 5 and 6, propagation of the laser beams from the laser media 1 and 2 to a point after passing through the diffraction grating 3 can be calculated for each of the emission points of the laser media 1 and 2.

By using the result of calculating the propagation of the laser beams from the laser media 1 and 2 to a point after passing through the diffraction grating 3, the distances $L_1$, $l_1$, $L_2$, and $l_2$ and the focal distances of the lenses 5 and 6 are set such that the laser beams emitted from the laser media 1 and 2 and diffracted by the diffraction grating 3 have the same beam diameter. Consequently, the laser beams diffracted by the diffraction grating 3 can have the same beam diameter. Thus, the distance $L_1$ between the laser medium 1 and the lens 5 is different from the distance $L_2$ between the laser medium 2 and the lens 6. Moreover, the distance $l_1$ between the lens 5 and the diffraction grating 3 is different from the distance $l_2$ between the lens 6 and the diffraction grating 3. Moreover, the focal distance of the lens 5 is different from the focal distance of the lens 6.

One of the laser media 1 and 2 can be a reference laser medium for which the corresponding lens 5 or 6 is not placed, and the laser beam that is emitted from the other of the laser media 1 and 2 and has passed through the diffraction grating 3 can be adjusted to coincide with the laser beam that is emitted from the one of the laser media 1 and 2 described above for which the corresponding lens 5 or 6 is not placed and has passed through the diffraction grating 3. In this case, the number of lenses in the optical path of the laser beam emitted from the reference laser medium can be made less than that in the optical path of the laser beam emitted from the other laser medium. This produces an effect of simplification of the configuration and a reduction in cost.

As described above, in the laser oscillator 100 according to the first embodiment, the lenses 5 and 6 are placed such that the laser beams having different wavelengths emitted from the laser media 1 and 2 are superimposed on the incident surface of the diffraction grating 3 so as to have the same outer diameter, and one laser beam obtained by the superimposing is emitted from the diffraction grating 3 toward the partially reflective mirror 4. Thus, the efficiency of the external resonator 10 can be improved and the degradation of the light-harvesting can be reduced. The laser beams emitted from the laser media 1 and 2 may not have the same outer diameter on the incident surface of the diffraction grating 3. However, if the lenses 5 and 6 make the difference in beam diameter between the laser beams emitted from the laser media 1 and 2 on the incident surface of the diffraction grating 3 small compared with the case where a plurality of laser beams are emitted from the laser media 1 and 2 and are then incident on the diffraction grating 3, it is still possible to obtain an effect of improving the efficiency of the external resonator 10 and reducing the degradation of the light-harvesting.

The above description is of a configuration that uses the diffraction grating 3 for the wavelength dispersive element; however, the wavelength dispersive element is not limited to a diffraction grating. A prism can also be used for the wavelength dispersive element. The above description is of a configuration that uses the partially reflective mirror 4 for the partially reflective element; however, the partially reflective element can also be implemented by a totally reflective mirror that is placed such that the laser beam partially hits the totally reflective mirror.

Second Embodiment

Figure 3:
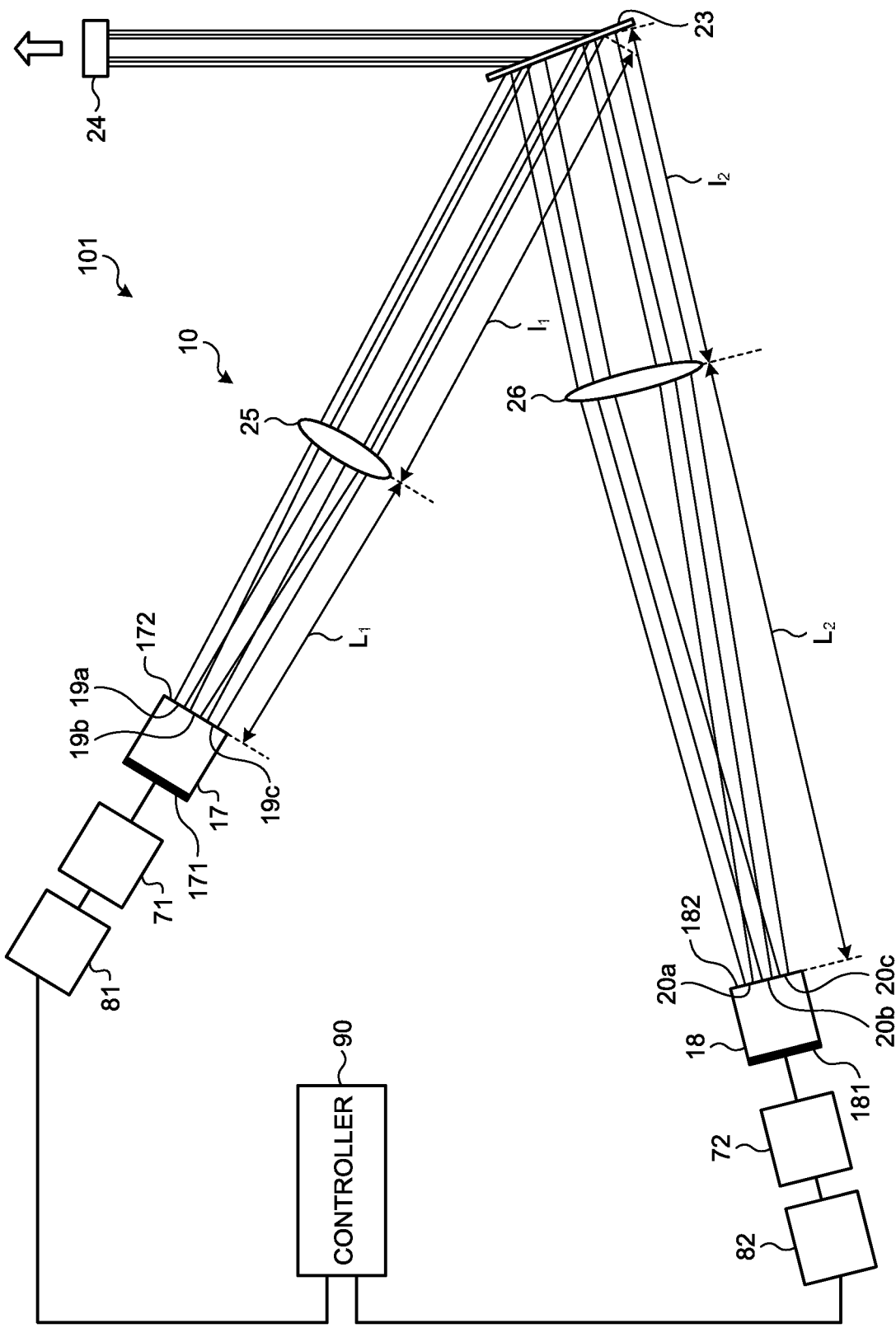
FIG. 3 is a diagram illustrating the configuration of a laser oscillator according to a second embodiment of the present invention.

FIG. 3 is a diagram illustrating the configuration of a laser oscillator according to a second embodiment of the present invention. A laser oscillator 101 according to the second embodiment includes the external resonator 10 having a configuration different from that in the laser oscillator 100 according to the first embodiment. The external resonator 10 in the laser oscillator 101 according to the second embodiment uses, as laser media, laser media 17 and 18, each having an array of a plurality of semiconductor laser bars or other emission points. A diffraction grating 23 is similar to the diffraction grating 3 in the first embodiment. A partially reflective mirror 24 is similar to the partially reflective mirror 4 in the first embodiment.

As illustrated in FIG. 3, the laser medium 17 has emission points 19a, 19b, and 19c, and the laser medium 18 has emission points 20a, 20b, and 20c. Reflective coatings 171 and 181, which are highly reflective and provided on the rear facets of the laser media 17 and 18, reflect majority of the light. Thus, the light generated by the laser media 17 and 18 is emitted forward from front facets 172 and 182.

In the first embodiment, the distance between the laser medium 1 and the lens 5 and the distance between the laser medium 2 and the lens 6 are individually adjusted, and the focal distances of the lenses 5 and 6 are different from each other. In the second embodiment, the optical system is different for each of the laser media 17 and 18. In the example in FIG. 3, a lens 25 is placed at a distance $L_1$ from the laser medium 17 and a lens 26 is placed at a distance $L_2$ from the laser medium 18.

The emission points 19a, 19b, and 19c in the laser medium 17, when viewed from the diffraction grating 23, form small angles between each other; therefore, variation in the beam diameter due to the beam diameter conversion effect of the diffraction grating 23 is low. In a similar manner, the emission points 20a, 20b, and 20c in the laser medium 18, when viewed from the diffraction grating 23, form small angles between each other; therefore, variation in the beam diameter due to the beam diameter conversion effect of the diffraction grating 23 is low. Different lenses are not used for each of the emission points 19a, 19b, 19c, 20a, 20b, and 20c, but the different lenses 25 and 26 are used for the laser media 17 and 18, respectively. This produces an effect where the difference in beam diameter between the laser beams can be made smaller than the case where a plurality of laser beams are incident on the diffraction grating 23 from the laser media 17 and 18.

Using the laser medium 17 having the emission points 19a, 19b, and 19c and the laser medium 18 having the emission points 20a, 20b, and 20c enables coupling of the laser beams from a larger number of emission points; therefore, a higher-output, higher-intensity wave-coupling laser device can be obtained at a lower cost.

In the second embodiment, to simplify the description, the laser medium 17 has three emission points 19a, 19b, and 19c, and the laser medium 18 has three emission points 20a, 20b, and 20c; however, the number of emission points in each of the laser media 17 and 18 is typically about a number in the tens and can possibly be as many as a number in the hundreds.

Third Embodiment

FIG. 4 is a diagram illustrating the configuration of a laser oscillator according to a third embodiment of the present invention. A laser oscillator 102 according to the third embodiment includes the external resonator 10 having a different configuration from that in the first and second embodiments.

In the first and second embodiments, the partially reflective mirror 4 or 24 is arranged to receive the first-order diffracted light of the laser beam from the diffraction grating 3 or 23. In the third embodiment, the second-order diffracted light of the laser beam from a diffraction grating 33 is returned to the laser media 1 and 2. Specifically, in the laser oscillator 102 according to the third embodiment, the laser media 1 and 2 and the diffraction grating 33 constitute the external resonator 10. With this configuration, the first-order diffracted light is diffracted at a diffraction angle of 0°. In other words, the first-order diffracted light is emitted perpendicularly to the diffraction grating 33. The first-order diffracted light is used as an output beam from the laser oscillator 102. The laser oscillator 102 includes the laser media 1 and 2; however, because the first-order diffracted light is emitted perpendicularly to the diffraction grating 33, a plurality of laser beams from the laser media 1 and 2 can be superimposed to form one laser beam.

In the laser oscillator 102 according to the third embodiment as well, the distance between the laser medium 1 and a lens 35, the distance between the lens 35 and the diffraction grating 33, the distance between the laser medium 2 and a lens 36, the distance between the lens 36 and the diffraction grating 33, and the focal distances of the lenses 35 and 36 are set such that the beam diameters of the laser beams from the laser media 1 and 2 after being diffracted by the diffraction grating 33 are the same. Consequently, the beam diameters of the laser beams after being diffracted by the diffraction grating 33 are the same. Therefore, the beam quality can be improved.

The laser oscillator 102 according to the third embodiment can, in addition to simplifying and downsizing the apparatus due to elimination of a partially reflective mirror, reduce the loss in the external resonator 10 and thus improve the laser oscillation efficiency.

The configurations presented in the embodiments above are examples of an aspect of the present invention, and they can be combined with other known technologies or can be partly omitted or modified without departing from the scope of the present invention.

REFERENCE SIGNS LIST 1, 2, 17, 18 laser medium; 3, 23, 33 diffraction grating; 4, 24 partially reflective mirror; 5, 6, 25, 26, 35, 36 lens; 10 external resonator; 11, 21 reflective coating; 12, 22 front facet; 19a, 19b, 19c, 20a, 20b, 20c emission point; 41 incident beam; 42 diffraction beam; 71, 72 drive circuit; 81, 82 drive power source; 90 controller; 100, 101, 102 laser oscillator.

The invention claimed is:
1. A laser oscillator comprising:
a plurality of laser media to emit laser beams having different wavelengths;
a wavelength dispersive element to emit, in a superimposed state, the laser beams incident from the laser media:
a partially reflective element to reflect part of the laser beams emitted from the wavelength dispersive element and return the part of the laser beams to the wavelength dispersive element, an.d to transmit a remainder; and
a plurality of lenses each disposed between a corresponding one of the laser media and the wavelength dispersive element, wherein
the lenses are each disposed in an optical path between a corresponding one of the laser media and the wavelength dispersive element,
the lenses superimpose the laser beams from the laser media on an incident surface of the wavelength dispersive element such that the laser beams have an equal outer diameter,
in each of the optical paths of the laser beams emitted from the laser media, a distance between the laser medium and the lens is different, and a distance between the lens and the wavelength dispersive element is different, and
the lenses of the plurality of lenses have different focal lengths.
2. The laser oscillator according to claim 1, wherein each of the laser media has a plurality of emission points to emit the laser beam.
3. The laser oscillator according to claim I. wherein the lenses are concave lenses.
4. A laser oscillator comprising:
a plurality of laser media to emit laser beams having different wavelengths;
a wavelength dispersive element to reflect part of the laser beams incident from the laser media and return the part of the laser beams to the laser media, and to emit, in a superimposed state, a remainder of the laser beams;
a plurality of lenses each disposed between a corresponding one of the laser media and the wavelength dispersive element, wherein
the lenses are each disposed in an optical path between a corresponding one of the laser media and the wavelength dispersive element, the lenses superimpose the laser beams from the laser media on an incident surface of the wavelength dispersive element such that the laser beams have an equal outer diameter, in each of the optical paths of the laser beams emitted from the laser media, a distance between the laser medium and the lens is different, and a distance between the lens and the wavelength dispersive element is different, and the lenses of the plurality of lenses have different focal lengths.

5. The laser oscillator according to claim 2, wherein the lenses are concave lenses.

6. The laser oscillator according to claim 4, wherein the lenses are concave lenses.

7. The laser oscillator according to claim 1, wherein: the wavelength dispersive element includes a diffraction grating.

8. The laser oscillator according to claim 1, wherein: the partially reflective element is a mirror.

9. The laser oscillator according to claim 1, wherein: a face of the wavelength dispersive element does not face directly towards the partially reflective element such that an exit angle of the laser beam from the wavelength dispersive element is other than 90 degrees.

10. The laser oscillator according to claim 4, wherein: the wavelength dispersive element includes a diffraction grating.

11. The laser oscillator according to claim 4, wherein: the partially reflective element is a mirror.

12. The laser oscillator according to claim 4, wherein: a face of the wavelength dispersive element does not face directly towards the partially reflective element such that an exit angle of the laser beam from the wavelength dispersive element is other than 90 degrees.

* * * * *